(12) United States Patent
Zschatzsch et al.

(10) Patent No.: US 9,257,530 B1
(45) Date of Patent: Feb. 9, 2016

(54) METHODS OF MAKING INTEGRATED CIRCUITS AND COMPONENTS THEREOF

(71) Applicant: GLOBALFOUNDRIES, Inc., Grand Cayman (KY)

(72) Inventors: Gerd Zschatzsch, Dresden (DE); Stefan Flachowsky, Dresden (DE); Jan Hoentschel, Dresden (DE)

(73) Assignee: GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 14/471,660

(22) Filed: Aug. 28, 2014

(51) Int. Cl.
*H01L 21/336* (2006.01)
*H01L 29/66* (2006.01)
*H01L 21/283* (2006.01)

(52) U.S. Cl.
CPC ........ *H01L 29/66545* (2013.01); *H01L 21/283* (2013.01)

(58) Field of Classification Search
CPC ............... H01L 21/76897; H01L 21/823814; H01L 21/28518; H01L 21/324; H01L 21/823425; H01L 29/517; H01L 29/665; H01L 29/66545; H01L 29/6659; H01L 29/66636; H01L 29/7833
USPC ......... 438/299, 303, 682, 199, 301, 649, 683; 257/E21.438, E21.507, E21.433, 257/E21.634, 369, 410
See application file for complete search history.

(56) References Cited

U.S. PATENT DOCUMENTS

| | | |
|---|---|---|
| 2011/0241200 A1 | 10/2011 | Dimitrakopoulos et al. |
| 2013/0178024 A1 | 7/2013 | Flachowsky et al. |
| 2014/0027859 A1 | 1/2014 | Gerhardt et al. |
| 2014/0084486 A1 | 3/2014 | Zhang et al. |
| 2014/0098459 A1 | 4/2014 | Lee et al. |
| 2014/0273386 A1* | 9/2014 | Tsao ..................... H01L 29/665 438/301 |

* cited by examiner

*Primary Examiner* — Julio J Maldonado
*Assistant Examiner* — Cory Eskridge
(74) *Attorney, Agent, or Firm* — Ingrassia Fisher & Lorenz, P.C.

(57) ABSTRACT

One exemplary embodiment provides a method of making an integrated circuit. The method includes forming a dummy gate structure above a semiconductor substrate, etching an exposed semiconductor substrate outside the dummy gate structure, depositing silicon oxide over the dummy gate structure and the semiconductor substrate to form a silicon oxide layer, etching source and drain contact vias through the silicon oxide layer, implanting source and drain dopants through the source and drain contact vias, removing the dummy gate structure, forming a final gate structure, etching substantially all of the silicon oxide layer, and depositing an ultra low K dielectric to form an ultra low K dielectric layer.

20 Claims, 3 Drawing Sheets

METHODS OF MAKING INTEGRATED CIRCUITS AND COMPONENTS THEREOF

TECHNICAL FIELD

The technical field generally relates to methods of making integrated circuits and, more particularly, to methods of making integrated circuits with minimized parasitic capacitance.

BACKGROUND

The majority of present day integrated circuits (ICs) are implemented by using a plurality of interconnected field effect transistors (FETs), also called metal oxide semiconductor field effect transistors (MOSFETs or MOS transistors). A MOS transistor includes a gate electrode as a control electrode overlying a semiconductor substrate and spaced-apart source and drain regions in the substrate between which a current can flow. A gate insulator is disposed between the gate electrode and the semiconductor substrate to electrically isolate the gate electrode from the substrate. A control voltage applied to the gate electrode through a gate contact controls the flow of current through a channel in the substrate underlying the gate electrode between the source and drain regions.

With the increased downscaling of the transistor structures, a number of parasitic capacitances are introduced into the device which can effectively reduce the speed (in terms of working frequency) of future and present technologies. This issue may be most pronounced for three dimensional device architectures such as fin-based or wire-based multi-gate transistors. A main concern is the parasitic capacitance between the source and drain regions, and the gate contacts, which is desirably drastically reduced.

Accordingly, it is desirable to provide integrated circuits with a reduced parasitic capacitance. It is also desirable to provide improved integrated circuits with respect to a ring oscillation and improved integrated circuit speed and performance. Furthermore it is desirable to provide a process for making integrated circuits that is easily integrateable into existing process lines. Additionally, other desirable features and characteristics of the present invention will become apparent from the subsequent detailed description of the invention and the appended claims, taken in conjunction with the accompanying drawings and this background of the invention.

BRIEF SUMMARY

One exemplary embodiment provides a method of making an integrated circuit. The method includes forming a dummy gate structure above a semiconductor substrate, etching an exposed semiconductor substrate outside the dummy gate structure, depositing silicon oxide over the dummy gate structure and the semiconductor substrate to form a silicon oxide layer, etching source and drain contact vias through the silicon oxide layer, implanting source and drain dopants through the source and drain contact vias, removing the dummy gate structure, forming a final gate structure, etching substantially all of the silicon oxide layer, and depositing an ultra low K dielectric to form an ultra low K dielectric layer.

Another exemplary embodiment provides a method of making an integrated circuit. The method includes providing a semiconductor substrate having a dummy gate structure disposed thereon, depositing a silicon oxide layer over the dummy gate structure and the semiconductor substrate to form a silicon oxide layer, etching substantially all of the silicon oxide layer, and depositing an ultra low K dielectric to form an ultra low K dielectric layer.

Yet another exemplary embodiment provides a method of making an integrated circuit. The method includes providing a semiconductor substrate with a dummy gate structure formed thereon and a silicon oxide layer covering the dummy gate structure and the semiconductor substrate, etching source and drain contact vias through the silicon oxide layer, implanting source and drain dopants through the source and drain contact vias, annealing after implanting, forming a silicide region in the source and drain contact vias, removing the dummy gate structure, forming a final gate structure, etching substantially all of the silicon oxide layer, and depositing an ultra low K dielectric to form an ultra low K dielectric layer.

BRIEF DESCRIPTION OF THE DRAWINGS

The various embodiments will hereinafter be described in conjunction with the following drawing figures, wherein like numerals denote like elements, and wherein.

DETAILED DESCRIPTION

The following detailed description is merely exemplary in nature and is not intended to limit the invention or the application and uses of the invention. Furthermore, there is no intention to be bound by any theory presented in the preceding background or the following detailed description.

As used herein, the term "semiconductor substrate" is used to encompass a substrate that includes one or more individual layers of semiconductor materials conventionally used in the semiconductor industry from which to make electrical devices. "Semiconductor material" includes monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. The semiconductor material is preferably a silicon substrate. The semiconductor substrate may be a bulk semiconductor wafer or may be a thin layer of semiconductor on an insulating layer (commonly known as silicon-on-insulator or SOI) that, in turn, is supported by a carrier wafer.

As used herein, the term "overlying" means "over" and "on," wherein "on" means in direct physical contact and "over" means that another layer may be interposed therebetween.

As used herein, the "N-channel field effect transistor" may be abbreviated "NFET".

As used herein, the term "P-channel field effect transistor" may be abbreviated "PFET".

As used herein, the terms "transistor", "device", and "integrated circuit" may be used interchangeably.

The embodiments disclosed herein overcome shortcomings by using an integration scheme that allows replacement of standard spacer material with ultralow dielectric coefficient (ULK) material. Thus, issues such as parasitic capacitance may be overcome, and speed and performance can be improved.

FIGS. 1-5 depict an illustrative example wherein the methods disclosed herein may be employed when the various devices are formed using so-called "replacement gate" (RMG) or "gate-last" techniques. In general, the replacement gate technique involves forming an integrated circuit with a sacrificial gate structure, including the formation of source and drain regions and metal silicide contact regions, and thereafter removing the sacrificial gate structure and replacing it with a final gate structure that typically includes at least one layer of metal or other electrically conductive material.

Figure 1:
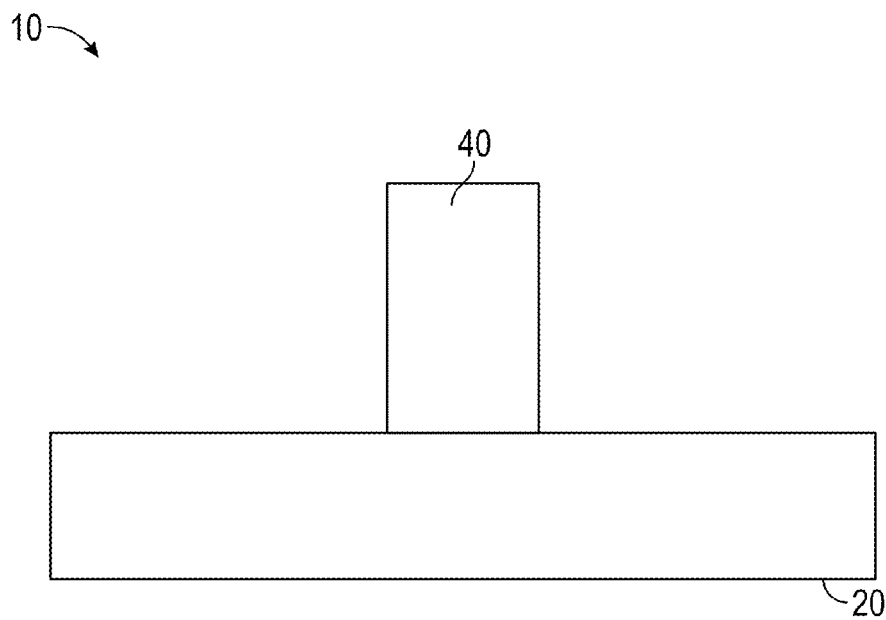
FIGS. 1-5 illustrate, in cross section, a method of making an integrated circuit in accordance with an exemplary embodiment.

Referring to FIG. 1, an exemplary integrated circuit 10 made in accordance with an exemplary process of fabrication is depicted. The integrated circuit 10 includes a semiconductor substrate 20 with a dummy gate structure or dummy gate 40 formed thereon, or positioned over the semiconductor substrate 20. The integrated circuit 10 may be a complementary metal oxide semiconductor (CMOS) device. At the point of processing depicted in FIG. 1, the basic structures have been formed. More specifically, at the point of fabrication depicted in FIG. 1, the sacrificial gate or dummy gate structure 40 that is formed as part of the process has been formed. Although not shown in the figures, the sacrificial structure 40 typically includes a sacrificial or dummy gate insulation layer, a dummy or sacrificial gate electrode, and a protective gate cap layer. However, in some applications, the dummy gate insulation layer may be incorporated into the final device. The various components and structures of the integrated circuit 10 may be formed using a variety of different materials and by performing a variety of known techniques. For example, the sacrificial gate insulation layer may include silicon oxide and the sacrificial gate electrode may include a polysilicon.

Figure 2:
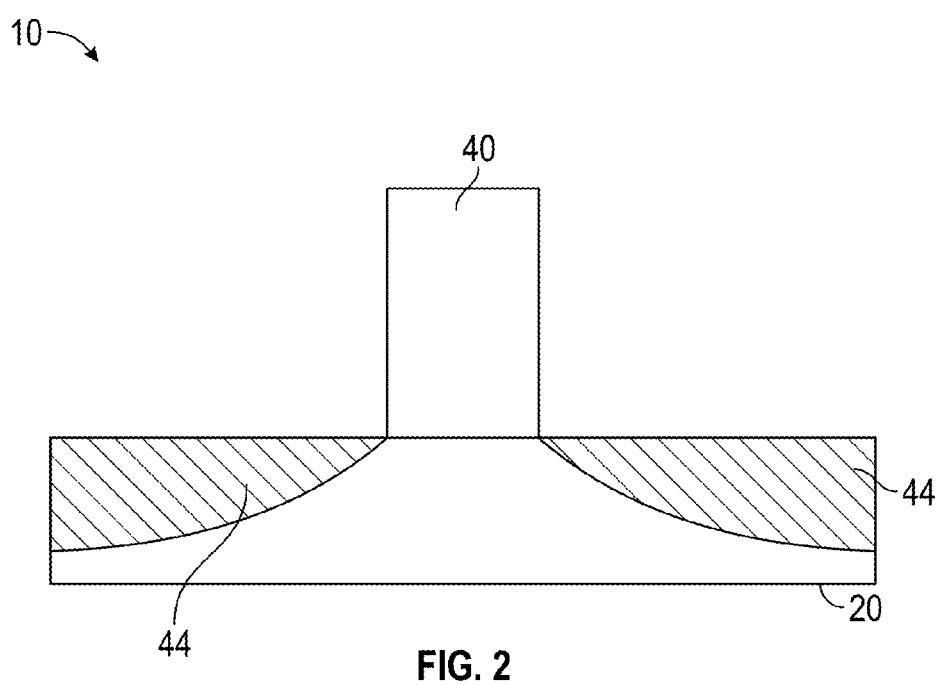

Referring to FIG. 2, an exposed portion of the semiconductor substrate 20 outside the dummy gate structure 40 is etched, typically about 5 to about 10 nanometers. Afterwards, an epitaxial region 44 is formed by epitaxially growing semiconductor material. In embodiments, the semiconductor material is in situ doped with source and drain dopants. However, it is to be appreciated that in other embodiments, the epitaxial region 44 may be doped after formation. Examples of suitable dopants include, but are not limited to, arsenic, boron, and phosphorus. Such an epitaxial deposition process is performed so as to form the epitaxial region 44 as an embedded stressor material.

Figure 3:
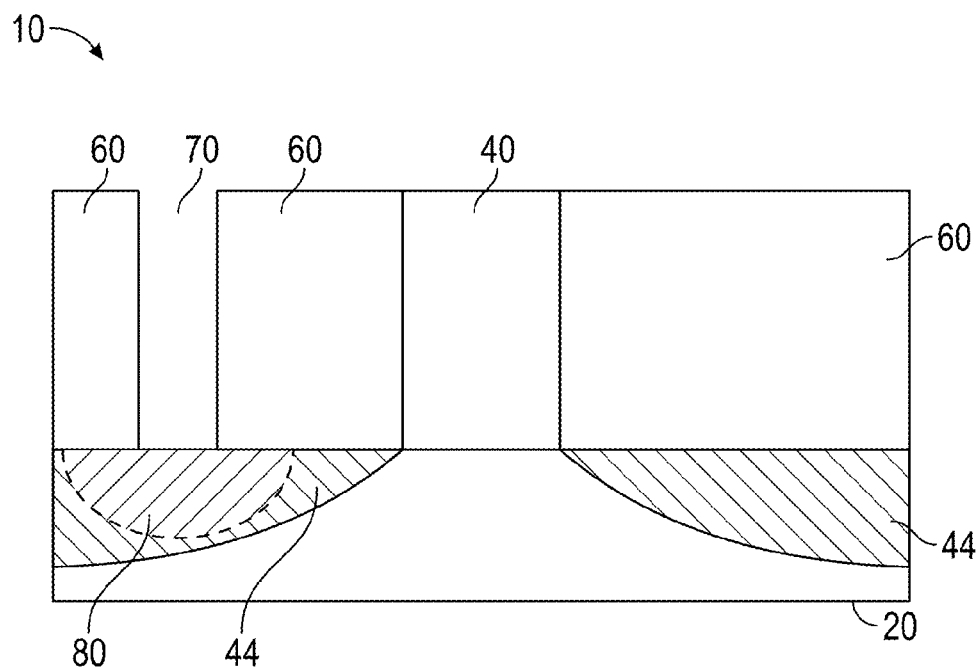

Referring to FIG. 3, silicon oxide is deposited to form a silicon oxide layer 60 over the dummy gate structure 40 and the semiconductor substrate 20. The silicon oxide layer 60 can be any suitable thickness, such as about 30 to about 100 nanometers, and is deposited using any suitable process, such as chemical vapor deposition (CVD). The silicon dioxide layer 60 can have superior dopant blocking capabilities as compared to, e.g., a ULK material. Thus, the silicon dioxide layer 60 can prevent unwanted dopant implantation and corresponding increase in K value in regions outside the desired doped area. That being done, the silicon oxide layer 60 undergoes chemical-mechanical polishing to remove extraneous materials. Afterwards, one or more etching processes of the silicon oxide layer 60 is conducted to form source and drain contact vias 70 through the silicon oxide layer 60. Next, a source and drain or implanted dopant region 80 is formed by implanting dopant material, such as N-type dopants for NFET devices and P-type dopants for PFET devices, into the semiconductor substrate 20. These dopants are implanted into the semiconductor substrate 20 using known masking and ion implantation techniques. N-type dopants include phosphorus or arsenic, and P-type dopants include boron, aluminum, gallium, or indium. Other processes may also be conducted, such as formation of halo implant regions, as well as formation of various layers or regions of silicon and/or germanium that may be employed in high-performance transistors. After implantation, annealing typically follows. The annealing is typically a diffusionless process, and serves to activate dopants and repair lattice damage where an optional heat treating process may not have been previously performed.

Figure 4:
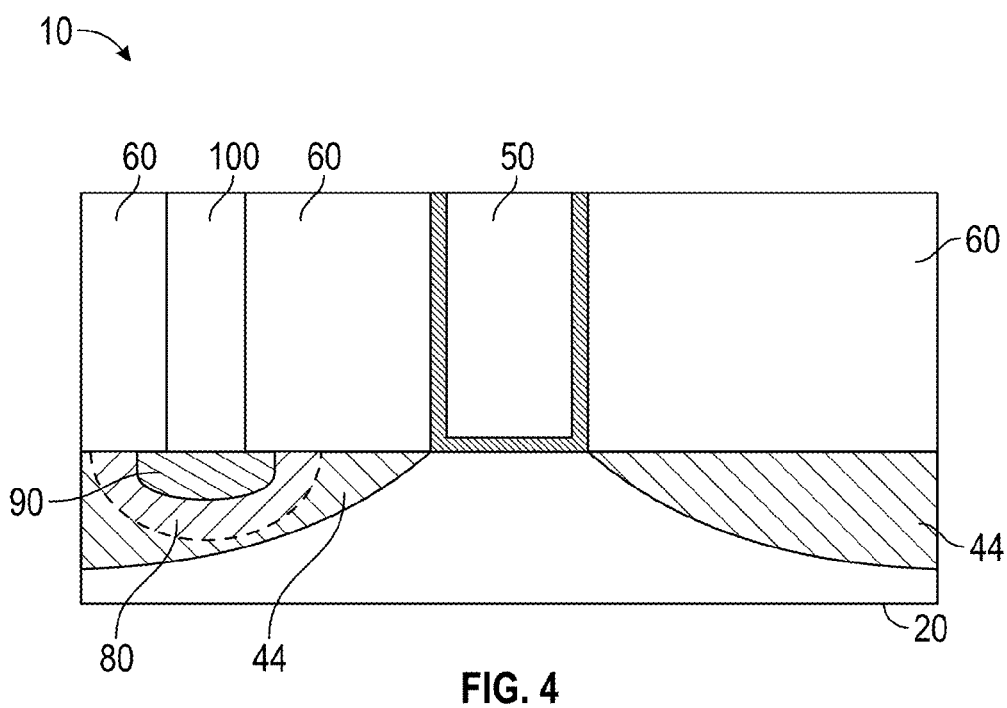

Referring to FIGS. 3-4, a silicide region 90 is formed in the source and drain contact vias 70 and the source and drain contact vias 70 are filled with a source/drain contact material to form a source/drain contact 100. The silicide region may include any one of several well-known refractory metal-based silicide materials, such as nickel silicide or cobalt silicide, and may be formed by using techniques and processing steps, such as depositing a refractory metal layer, performing a thermal treatment to cause a chemical reaction between the refractory metal layer and the underlying semiconductor materials of the semiconductor substrate 20. In one exemplary embodiment, the source/drain contact 100 includes tungsten. The dimensions of the source/drain contact 100 and its position may vary depending on the technology node, and can follow standards consistent with the assessment of the International Technology Roadmap for Semiconductors. Moreover, the dummy gate structure 40 is removed and replaced with a final gate structure 50 using any suitable process, such as a replacement metal gate process. Particularly, one or more etching processes are performed to remove the dummy gate without damaging the silicon oxide layer 60 to thereby define a gate cavity with a replacement gate subsequently formed therein.

Figure 5:
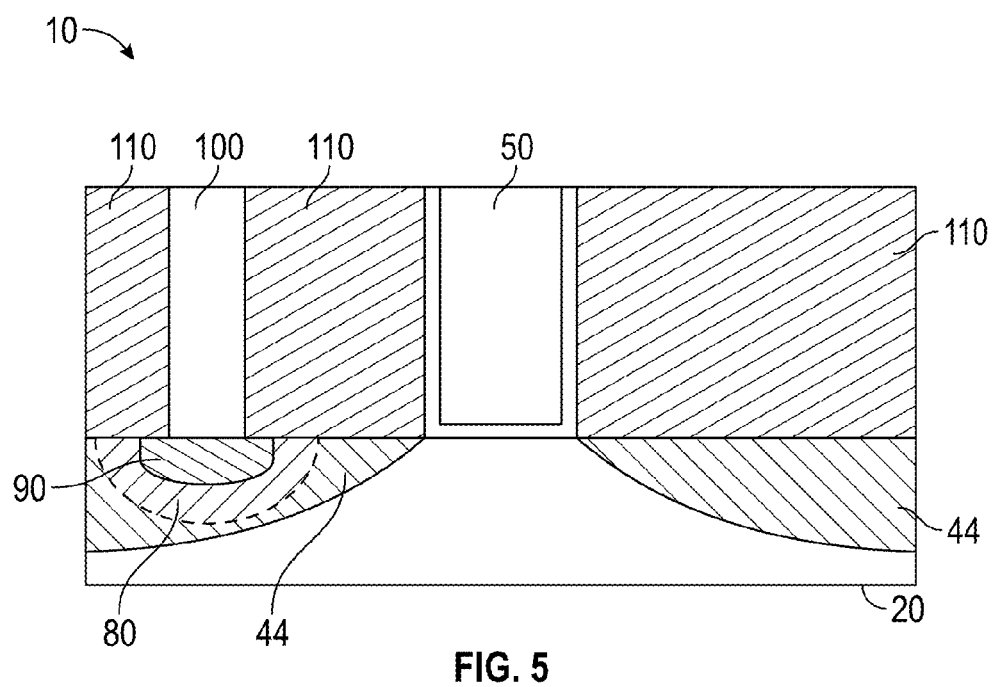

Referring to FIG. 5, the remaining silicon oxide layer 60 is etched and removed, and an ultra low K dielectric is deposited using any suitable process, such as a plasma enhanced chemical vapor deposition process, to form an ultra low K dielectric layer 110. Generally, the ultra low K dielectric layer 110 has a K value of no more than about 2.7. In embodiments, the ultra low K dielectric layer 110 or layers are formed with various precursors and a silicon, an oxygen and a methyl and methylene gas mix. As such, a porous silicon oxide layer contains at least some carbon, and has a K value of no more than about 2.7. Next, chemical mechanical polishing follows and standard back end of line fabrication is conducted to complete manufacture of the integrated circuit.

The embodiments disclosed herein are applicable for planar and three dimensional device architectures, such as a fin-based or wire-based multi-gate transistors using a replacement gate integration scheme. Moreover, the embodiments are applicable to highly scaled device architectures, such as about 28 nanometers, or even about 14 nanometers, or less, and applicable to large variety of substrate materials.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A method of making an integrated circuit, wherein the method comprises:

forming a dummy gate structure over a semiconductor substrate;

etching an exposed portion of the semiconductor substrate outside the dummy gate structure;

depositing silicon oxide over the dummy gate structure and the semiconductor substrate to form a silicon oxide layer;
etching source and drain contact vias through the silicon oxide layer;
implanting source and drain dopants through the source and drain contact vias;
removing the dummy gate structure;
forming a final gate structure;
etching substantially all of the silicon oxide layer; and
depositing an ultra low K dielectric to form an ultra low K dielectric layer.

2. The method according to claim 1, wherein the ultra low K dielectric is deposited by plasma enhanced chemical vapor deposition.

3. The method according to claim 1, wherein the dopants are chosen from N-type dopants and P-type dopants.

4. The method according to claim 1, wherein the ultra low K dielectric layer has a K value of no more than about 2.7.

5. The method according to claim 1, further comprising forming a silicide region in the source and drain contact vias after implanting the source and drain dopants.

6. The method according to claim 5, further comprising annealing the semiconductor substrate after implanting and before forming the silicide region.

7. The method according to claim 6, wherein the final gate structure is formed by a replacement metal gate process.

8. The method according to claim 1, wherein the final gate structure is formed by a replacement metal gate process.

9. The method according to claim 1, wherein the etching of the exposed portion of the semiconductor substrate outside the dummy gate structure removes about 5 to about 10 nanometers of the exposed portion of the semiconductor substrate.

10. The method according to claim 9, further comprising epitaxially growing silicon in the source and drain contact vias with in-situ doping with a dopant chosen from boron, phosphorus, or arsenic.

11. A method of making an integrated circuit, wherein the method comprises:
providing a semiconductor substrate having a dummy gate structure disposed thereon;
depositing a silicon oxide over the dummy gate structure and the semiconductor substrate to form a silicon oxide layer;
etching source and drain contact vias through the silicon oxide layer;
implanting source and drain dopants through the source and drain contact vias;
etching substantially all of the silicon oxide layer; and
depositing an ultra low K dielectric to form an ultra low K dielectric layer.

12. The method according to claim 11, wherein the ultra low K dielectric layer has a K value of no more than about 2.7.

13. The method according to claim 11, wherein a final gate structure is formed by a replacement metal gate process.

14. The method according to claim 11, wherein the ultra low K dielectric is deposited by plasma enhanced chemical vapor deposition.

15. The method according to claim 11, wherein the semiconductor substrate further comprises dopants chosen from N-type dopants and P-type dopants.

16. A method of making an integrated circuit, wherein the method comprises:
providing a semiconductor substrate with a dummy gate structure formed thereon and a silicon oxide layer over the dummy gate structure and the semiconductor substrate;
etching of source and drain contact vias through the silicon oxide layer;
implanting source and drain dopants through the source and drain contact vias;
annealing after implanting;
forming a silicide region in the source and drain contact vias;
removing the dummy gate structure;
forming a final gate structure;
etching to remove substantially all of the silicon oxide layer; and
depositing an ultra low K dielectric to form an ultra low K dielectric layer.

17. The method according to claim 16, wherein the ultra low K dielectric is deposited by plasma enhanced chemical vapor deposition.

18. The method according to claim 16, wherein the ultra low K dielectric layer has a K of no more than about 2.7.

19. The method according to claim 16, wherein the final gate structure is formed by a replacement metal gate process.

20. The method according to claim 16, wherein the semiconductor substrate further comprises dopants chosen from N-type dopants and P-type dopants.

* * * * *